(12) United States Patent
Tan et al.

(10) Patent No.: US 11,196,243 B2
(45) Date of Patent: Dec. 7, 2021

(54) PIN-SHORT DETECTION CIRCUITS

(71) Applicant: TEXAS INSTRUMENTS INCORPORATED, Dallas, TX (US)

(72) Inventors: Runqin Tan, Shenzhen (CN); Jiancong Ruan, Shenzhen (CN); Peisheng Zhu, Shenzhen (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/805,313

(22) Filed: Feb. 28, 2020

(65) Prior Publication Data

US 2021/0119527 A1    Apr. 22, 2021

Related U.S. Application Data

(63) Continuation of application No. PCT/CN2019/111958, filed on Oct. 18, 2019.

(30) Foreign Application Priority Data

Oct. 18, 2019  (WO) .............. PCT/CN2019/111958

(51) Int. Cl.
  *H02H 3/08* (2006.01)
  *H05K 1/18* (2006.01)
  *H01L 23/31* (2006.01)
  *H02H 7/12* (2006.01)

(52) U.S. Cl.
  CPC .......... *H02H 3/08* (2013.01); *H01L 23/3114* (2013.01); *H02H 7/12* (2013.01); *H02H 7/1213* (2013.01); *H05K 1/181* (2013.01)

(58) Field of Classification Search
  CPC .......... H02H 3/08; H02H 7/12; H02H 7/1213; H05K 1/181; H01L 23/3114
  See application file for complete search history.

(56) References Cited

U.S. PATENT DOCUMENTS

| 2005/0146823 | A1  | 7/2005 | Saka et al. |
| 2013/0134985 | A1* | 5/2013 | Bernardon ............. G01R 31/40 324/527 |
| 2014/0285229 | A1  | 9/2014 | Chia et al. |

FOREIGN PATENT DOCUMENTS

| CN | 104426343 A  | 3/2015 |
| CN | 109217667 A  | 1/2019 |
| JP | 2001066340 A | 3/2001 |

OTHER PUBLICATIONS

Search Report for PCT Application No. PCT/CN2019/111958, date of mailing of the international search report dated Jul. 20, 2020, 2 pages.
CN109217667A, English Machine Translation, 24 pages.
CN104426343A, English Machine Translation, 24 pages.
JP2001066340A, English Machine Translation, 16 pages.

* cited by examiner

*Primary Examiner* — Gary L Laxton
(74) *Attorney, Agent, or Firm* — Ray A. King; Charles A. Brill; Frank D. Cimino

(57) ABSTRACT

An example system includes an input voltage terminal; a power converter integrated circuit (IC) package fuselessly coupled to the input voltage terminal and having first and second pins, the power converter IC package configured to detect a short between the first and second pins; and a load circuit coupled to the power converter IC package.

19 Claims, 10 Drawing Sheets

PIN-SHORT DETECTION CIRCUITS

BACKGROUND

Various electrical circuits, such as power converters, are housed in packages. A package includes the electrical circuit and a protective material, such as epoxy, to protect the electrical circuit from damage due to external factors (e.g., extreme temperatures, liquids, blunt force). The package also includes multiple pins that facilitate electrical communication between the circuit housed within the package and electrical devices external to the package, for example, devices that are mounted along with the package on a printed circuit board (PCB). Package pin layouts vary, with some packages having a finer pin pitch than other packages.

SUMMARY

At least some aspects of the present disclosure provide for a system. In some examples, the system includes an input voltage terminal; a power converter integrated circuit (IC) package fuselessly coupled to the input voltage terminal and having first and second pins, the power converter IC package configured to detect a short between the first and second pins; and a load circuit coupled to the power converter IC package.

Other aspects of the present disclosure provide for a pin-short detection circuit. In some examples, the pin-short detection circuit includes a first transistor having a first gate terminal, a first source terminal, and a first drain terminal, the first gate terminal coupled to an input voltage terminal and the first source terminal coupled to a first output node of the circuit via multiple bias transistors. The circuit includes a resistor coupled to the first gate terminal and the first source terminal; a second transistor having a second gate terminal coupled to the first drain terminal, a second source terminal coupled to a first node of the circuit, and a second drain terminal coupled to a second output node of the circuit. The circuit includes a first bias transistor coupled to the first node of the circuit and to the first drain terminal and a second bias transistor coupled to the first and second output nodes.

Other aspects of the present disclosure provide for a power converter integrated circuit (IC) package. In some examples, a power converter IC package includes a power transistor and a pin-short detection circuit coupled to the power transistor and comprising: a first transistor configured to compare first and second signals, the first signal based on a signal received at a first pin of the package and the second signal based on a signal received at a second pin of the package; and a second transistor configured to provide an output signal having either a first state or a second state based on the comparison. The first state indicates a primary operation mode and the second state indicates a pin-short operation mode. The power transistor is to be operated using the output signal.

BRIEF DESCRIPTION OF THE DRAWINGS

For a detailed description of various examples, reference will now be made to the accompanying drawings in which.

DETAILED DESCRIPTION

As explained above, package pin layouts vary. Some pin layouts are susceptible to electrical shorts between pins. For example, some power converter integrated circuit (IC) packages include an input voltage pin, an input ground pin, and an output voltage pin, and in some such packages, the output voltage pin may be susceptible to shorting with the input voltage pin or with the input ground pin. Besides electrical damage to the package, such shorts can also result in smoke or fire, which represents both a safety hazard and a threat to the electronic device in which the package is contained. Some currently used solutions to mitigate the deleterious effects of a pin-short event on a power converter IC package include adding a fuse to the system, for example on a PCB on which the power converter IC package is mounted. The fuse trips when a short circuit occurs between pins of the package, preventing smoke and fire and mitigating electrical damage. The fuse, however, occupies a substantial amount of space on the PCB and incurs an undesirably high cost.

Accordingly, described herein are various examples of power converter IC packages that comprise pin-short detection circuits to overcome the challenges mentioned above. Implementing the pin-short detection circuit described in this disclosure enables the power converter IC package to detect a short circuit between its pins and to turn off the package (e.g., cease supplying power) in response to the detection of the short circuit. Because the power converter IC package described herein contains a pin-short detection circuit that is able to detect short circuits between the pins of the package, the aforementioned fuse can be omitted, thus saving substantial PCB space and costs. In addition, inclusion of the pin-short detection circuit inside the power converter IC package does not necessitate altering the form factor of the power converter IC package. Moreover, although the examples that follow are described in the context of power converter IC packages, the pin-short detection circuit is not limited in its application to power converter IC packages. Rather, the pin-short detection circuit can be implemented in any of a variety of packages that are susceptible to pin shorts. Illustrative power converter IC packages containing example pin-short detection circuits are now described in detail with respect to the drawings.

Figure 1:
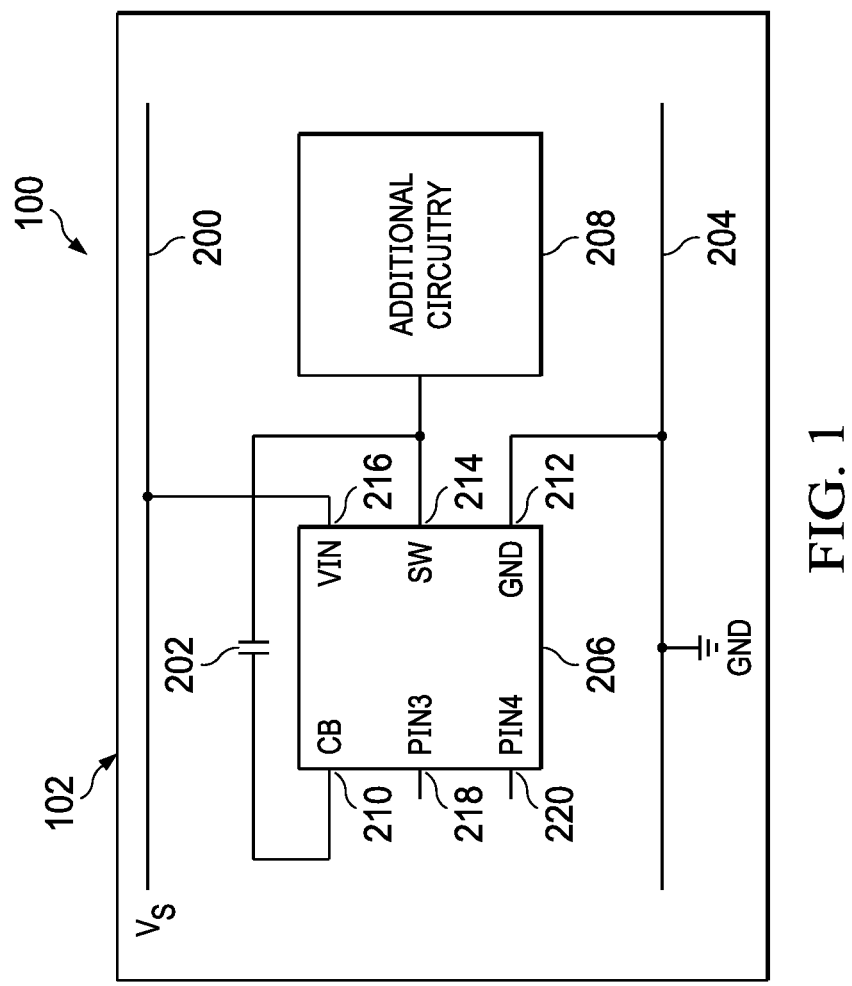
FIG. 1 depicts a power converter integrated circuit (IC) package contained within an electronic device, in accordance with various examples.

FIG. 1 depicts a power converter integrated circuit (IC) package 206 contained within an electronic device 100, which can be any type of electronic device (e.g., handheld communication devices, medical devices, consumer electronics, sensors, etc.). The following paragraphs describe examples of different electrical circuits, such as power converters, that are include in the electronic device 100. These electrical circuits can be housed in packages that include multiple pins for facilitating electrical communication between the electrical circuit housed within the package and electrical circuits external to the package. The examples illustrate a pin-short detection circuit housed inside the package to detect shorts between pins of the package. The specific technical advantages produced by these pin-short detection circuits—e.g., saving substantial PCB space, reducing safety hazards of smoke and fire, and mitigating electrical damage—are also described.

In some examples, the electronic device 100 includes a PCB 102 comprising a Vs path 200 (also referred to as an input voltage terminal), a power converter IC package 206 coupled to the Vs path 200, and additional circuitry 208 configured to receive power from the power converter IC package 206. The power converter IC package 206 includes any suitable type of power converter, such as a buck converter, a boost converter, or a buck-boost converter, as examples. The additional circuitry 208 includes any circuitry that can benefit from the output of a power converter. In some examples, the additional circuitry 208 is a load circuit. The PCB 102 also comprises a GND path 204. While the power converter IC package 206 depicted in FIG. 1 has six pins, the scope of this disclosure is not limited to a six-pin package. Rather, the aforementioned pin-short detection circuit can be implemented in any of a variety of packages, such as, for example, an eight-pin or a ten-pin package, without altering the form factor of the package. For illustrative purposes, the following discussion will focus on a six-pin power converter package, with the understanding that the principles described herein can be extended to virtually any type of package.

Examples in which a fuse is missing between the power converter IC package 206 and the Vs path 200 are fuseless examples, meaning that the power converter IC package 206 and the Vs path 200 are fuselessly coupled to each other. In some such fuseless examples, the coupling between the power converter IC package 206 and the Vs path 200 is a direct coupling in which no intervening electrical components (e.g., fuses, resistors, capacitors, inductors, transistors, etc.) are present that substantially alter the functional relationship between the power converter IC package 206 and the Vs path 200 or that have the potential to substantially alter the functional relationship between the power converter IC package 206 and the Vs path 200.

The pins of the power converter IC package 206 include a VIN pin 216 directly coupled to the Vs path 200, a GND pin 212 coupled to the ground path 204, an output SW pin 214 coupled to and configured to provide output power to the additional circuitry 208, and an input CB pin 210 that couples to the SW pin 214 through a capacitor 202. In some examples, the capacitor 202 is placed on the PCB 102. However, in other examples, the capacitor 202 is external to the electronic device 100 and coupled to the SW pin 214 and CB pin 210 via metal traces, or paths, on the PCB 102. The remainder of this discussion assumes that the capacitor 202 is coupled to the power converter IC package 206 on the PCB 102 internal to the electronic device 100. A remaining two pins, PIN3 218 and PIN4 220 are configurable to provide the circuit with additional inputs or outputs as desired.

In further examples, the power converter IC package 206 is configured to detect a short between a first and second pin of the power converter IC package 206. For example, due to design considerations, such as the need to minimize electromagnetic interference, metallization resistance, and/or parasitic inductance, the VIN pin 216 and the SW pin 214 or the SW pin 214 and the GND pin 212 are directly adjacent to each other, creating the possibility of a short between the VIN pin 216 and SW pin 214 or between the SW pin 214 and the GND pin 212. The pin-short detection circuit within the power converter IC package 206 is able to detect such shorts to take remedial action as described below thus obviating any need for an expensive, space-occupying fuse.

Figure 2:
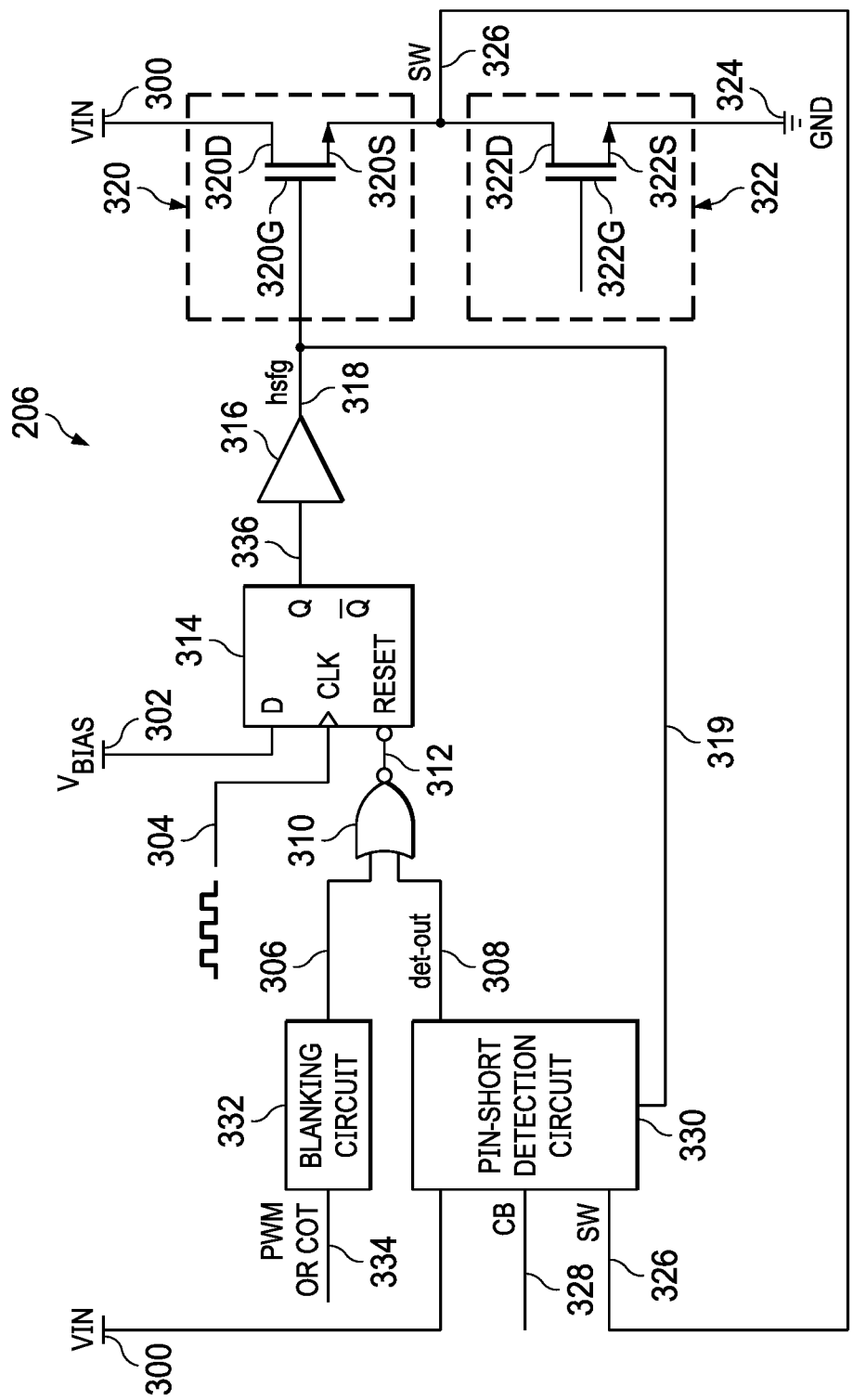
FIG. 2 depicts a schematic diagram of a power converter IC package containing a pin-short detection circuit, in accordance with various examples.

FIG. 2 depicts a schematic diagram of the contents of the power converter IC package 206, in accordance with various examples. In some examples, the power converter IC package 206 includes a blanking circuit 332, a pin-short detection circuit 330, a NOR gate 310, a D flip-flop 314, a buffer 316, a high-side field effect transistor (FET) 320, and a low-side FET 322. The blanking circuit 332 can be any circuit designed to reduce noise of a received signal 334, such as a pulse-width modulated (PWM) or control on time (COT) signal. Illustrative details regarding the contents of the pin-short detection circuit 330 are provided below with respect to FIG. 3. In addition, while the power converter IC package 206 depicts the NOR gate 310 and the D flip-flop 314, the power converter IC package 206 can utilize any electronic circuit that performs an equivalent function to the NOR gate 310 and the D flip-flop 314, as discussed below with regard to FIG. 4.

Figure 6:
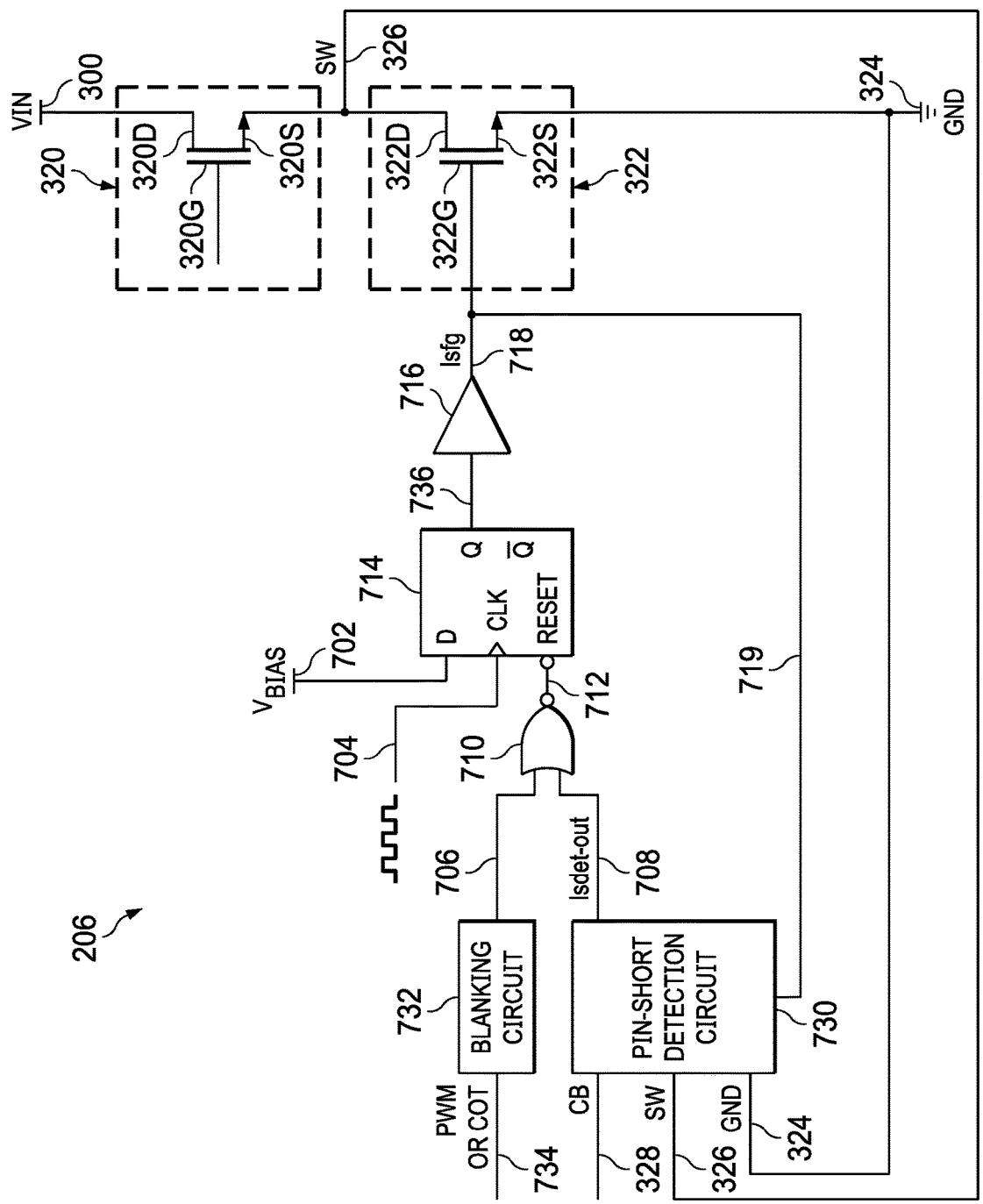
FIG. 6 depicts a schematic diagram of a power converter IC package containing a pin-short detection circuit, in accordance with various examples.

In some examples, the FETs 320, 322 are metal-oxide-semiconductor-field-effect-transistors (MOSFETs). In one example, the FETs 320, 322 are n-channel MOSFETs (nMOSFETs or NMOS). In a further example, the FETs 320, 322 are high-voltage FETs. A gate terminal 320G of the high-side FET 320 is coupled to an output path 318 of the buffer 316 carrying a signal hsfg and a feedback path 319 to the pin-short detection circuit 330. A drain terminal 320D of the high-side FET 320 is coupled to a VIN path 300, which, in turn, is coupled to the VIN pin 216 of the power converter IC package 206 (FIG. 1). In this manner, the drain terminal 320D receives a voltage signal VIN from Vs along the Vs path 200. A source terminal 320S of the high-side FET 320 is coupled to an SW path 326, which, in turn, is coupled to the SW pin 214 of the power converter IC package 206. In this manner, the SW path 326 carries a signal SW. A drain terminal 322D of the low-side FET 322 is also coupled to the SW path 326. As the operation of the FETs 320, 322 provides the signal SW for output at the SW pin 214, each is referred to as a power transistor. A source terminal 322S of the low-side FET 322 is coupled to a GND path 324, which, in turn, is coupled to the GND pin 212 of the power converter IC package 206. While FIG. 2 does not depict a circuit for driving a gate terminal 322G of the low-side FET 322, FIG. 6 depicts an illustrative circuit for driving the gate terminal 322G.

The pin-short detection circuit 330 includes multiple input paths, including the VIN path 300 (which carries the voltage signal VIN), the SW path 326 (which carries the signal SW), the feedback path 319 (which carries the signal hsfg), and a bootstrap capacitor path 328 (which carries a signal CB). The bootstrap capacitor, or CB, path 328 is coupled to the CB pin 210 of the power converter IC package 206 (FIG. 1). The pin-short detection circuit 330 has an output path 308 carrying a signal det_out.

In some examples, the output path 308 and an output path 306 of the blanking circuit 332 are coupled to inputs of the NOR gate 310. An output path 312 of the NOR gate 310 is coupled to a reset input of the D flip-flop 314. The D flip-flop 314 also receives a clock signal Clk on a Clk path 304 and a voltage bias (VBIAS) on a VBIAS path 302 as clock and set, or D, inputs, respectively. An output path 336 of the D flip-flop 314 is coupled to an input of the buffer 316. As mentioned previously, the output path 318 of the buffer 316 is coupled to the gate terminal 320G of the high-side FET 320 as well as the feedback path 319 to the pin-short detection circuit 330. The operation of the power converter IC package 206 is now described for a pin-short operation mode and a primary, or normal, operation mode.

In one example using the circuit of FIG. 2, when a pin short occurs between the SW pin 214 and the GND pin 212 (FIG. 1), the pin-short detection circuit 330 asserts the signal det_out on the output path 308 as a high. (As mentioned, the structural and functional details of the pin-short detection circuit 330 are provided below with respect to FIG. 3.) Because the signal det_out is high, the signal on the output path 312 of the NOR gate 310 is low. When the reset input of the D flip-flop 314 receives a low signal, the signal on the output path 336 of the D flip-flop 314 is set to low regardless of the other inputs of the D flip-flop 314. (The structural and functional details of the operation of the D flip-flop 314 are provided below with respect to FIG. 4.) If the signal on the output path 336 is low, then the signal hsfg, after passing through the buffer 316, is also low. A low at the gate terminal 320G of the high-side FET 320 switches off the high-side FET 320. As a result of the off state of the high-side FET 320, no signal SW is transmitted along the SW path 326 to the SW pin 214 of power converter IC package 206. This is referred to as a pin-short operation mode.

In another example using the circuit of FIG. 2, no pin short occurs between the SW pin 214 and the GND pin 212. In this scenario, the signal det_out on the output path 308 is not asserted high. The signal on the output path 312 of the NOR gate 310 is controlled by the blanking circuit 332. More specifically, if the blanking circuit 332 outputs a low signal, the signal on the output path 312 is high, and so the high-side FET 320 is controlled according to the clock signal on the Clk path 304. If the blanking circuit 332 outputs a high signal, the signal on the output path 312 is low, and so the high-side FET 320 is turned off. The specific timing and operational details of the blanking circuit 332 can be implemented as desired to achieve specific performance or noise elimination goals. When the operation of a power transistor is controlled by the clock signal on the Clk path 304 or the blanking circuit 332, this operation is referred to as a normal operation mode (also occasionally referred to herein as a primary operation mode).

While in this discussion, the signal det_out is asserted as a high when the pin-short detection circuit 330 detects a pin-short event, the signal det_out could also be asserted as a low when the pin-short detection circuit 330 detects a pin-short event as long as the subsequent logic circuitry, currently represented by the NOR gate 310 and the D flip-flop 314, is adjusted accordingly, as discussed in regards to FIG. 4 below. When the pin-short detection circuit 330 detects a pin-short event, regardless of whether the signal det_out is asserted as a high or as a low, the state is referred to as the pin-short operation mode. In some examples, in response to the signal det_out indicating the pin-short operation mode, the signal hsfg is driven low, which, in turn, switches off the high-side FET 320. The ability of the pin-short detection circuit 330 to switch off the high-side FET 320 during a pin-short event reduces the likelihood of smoke and fire and stops the propagation of the signal SW, advantageously helping to mitigate electrical damage to the circuitry without using a fuse.

Figure 3:
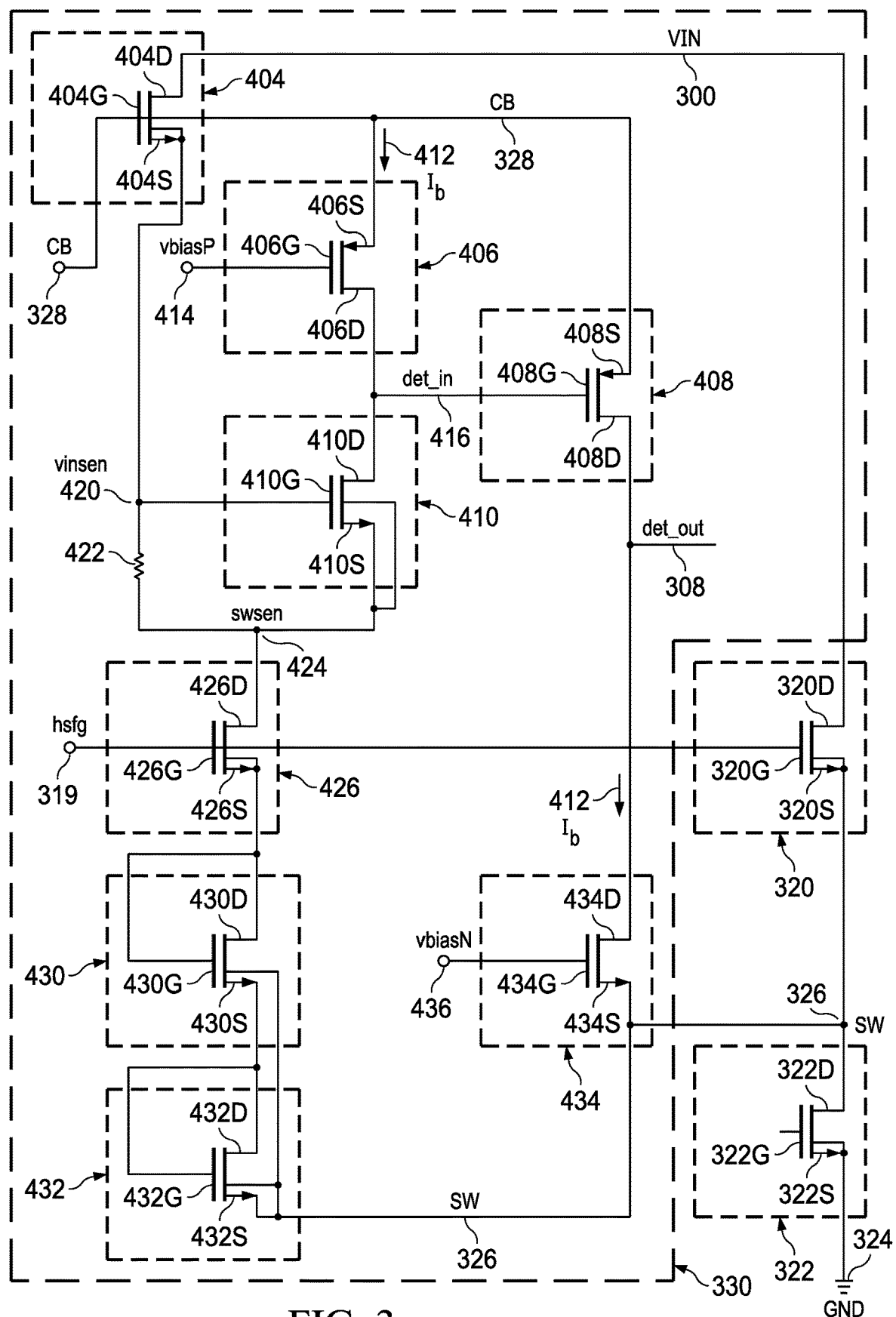
FIG. 3 depicts a schematic diagram of a pin-short detection circuit, in accordance with various examples.

FIG. 3 depicts a schematic diagram of the pin-short detection circuit 330, in accordance with various examples. In some examples, the pin-short detection circuit 330 includes a transistor 404, a transistor 406, a transistor 408, a transistor 410, a transistor 426, a transistor 430, a transistor 432, a transistor 434, and a resistor 422. In some examples, the transistors 404, 406, 408, 410, 426, 430, 432, 434 are FETs. In further examples, the transistors 404, 410, 426, 430, 432, 434 are nMOSFETs or NMOS, and the transistors 406, 408 are p-channel MOSFETs (pMOSFETs or PMOS). In further examples, the transistors 404, 426 are high-voltage FETs.

The pin-short detection circuit 330 includes multiple input paths. The VIN path 300 is coupled to the VIN pin 216 of the power converter IC package 206 (FIG. 1) and carries the voltage signal VIN. The CB path 328 is coupled to the CB pin 210 of the power converter IC package 206 and carries the signal CB (FIG. 1). The feedback path 319 is coupled to the output path 318 of the buffer 316 and the gate terminal 320G of the high-side FET 320 (FIG. 2) and carries the signal hsfg. The SW path 326 is coupled to the SW pin 214 (FIG. 1), the source terminal 320S of the high-side FET 320, and the drain terminal 322D of the low-side FET 322, and it carries the signal SW (FIG. 2). A path 414 carries a vbiasP voltage. A path 436 carries a vbiasN voltage. As described above in regard to FIG. 2, the pin-short detection circuit 330 comprises the output path 308 carrying the signal det_out.

The transistor 404 comprises a drain terminal 404D, a gate terminal 404G, and a source terminal 404S. The drain terminal 404D is coupled to the VIN path 300. The gate terminal 404G is coupled to the CB path 328. The source terminal 404S is coupled to a vinsen path 420, which carries a signal vinsen.

The transistor 410 comprises a drain terminal 410D, a gate terminal 410G, and a source terminal 410S. The gate terminal 410G is coupled to the vinsen path 420, the source terminal 404S of the transistor 404, and a first end of the resistor 422. The drain terminal 410D, herein referred to as a non-control terminal, is coupled to a det_in path 416 carrying a signal det_in. The source terminal 410S is coupled to a swsen path 424 carrying a signal swsen and is also coupled to a second end of resistor 422. The resistor 422 can be any resistance value sufficient to prevent accidental turn-on of the transistor 410, for example, due to noise or parasitic capacitance.

The transistor 426 has a drain terminal 426D, a gate terminal 426G, and a source terminal 426S. The feedback path 319 is coupled to the gate terminal 426G and the gate terminal 320G of the high-side FET 320. The drain terminal 426D is coupled to the swsen path 424, the source terminal 410S of the transistor 410, and the second end of the resistor 422. The source terminal 426S is coupled to a drain terminal 430D of the transistor 430 and a gate terminal 430G of the transistor 430. (The drain terminal 430D and the gate terminal 430G are coupled to each other as well.) A source terminal 430S of the transistor 430 is coupled to a drain terminal 432D of the transistor 432 and a gate terminal 432G of the transistor 432. (The drain terminal 432D and the gate terminal 432G are coupled to each other as well.) A source terminal 432S of the transistor 432 is coupled to the SW path 326 carrying the signal SW, which is used as a basis for the signal swsen when comparing the signals vinsen and swsen, as mentioned above and as described in detail below.

The transistor 406 comprises a drain terminal 406D, a gate terminal 406G, and a source terminal 406S. The CB path 328 is coupled to the source terminal 406S. The gate terminal 406G is coupled to the path 414 carrying the vbiasP voltage. The drain terminal 406D is coupled to the det_in path 416 carrying the signal det_in and the drain terminal 410D of the transistor 410.

The transistor 408 comprises a drain terminal 408D, a gate terminal 408G, and a source terminal 408S. The source terminal 408S is coupled to the CB path 328. The gate terminal 408G is coupled to the det_in path 416 carrying the signal det_in, the drain terminal 410D of the transistor 410, and the drain terminal 406D of the transistor 406. The drain terminal 408D is coupled to the output path 308 carrying the signal det_out.

The transistor 434 comprises a drain terminal 434D, a gate terminal 434G, and a source terminal 434S. The drain terminal 434D is coupled to the output path 308 carrying the signal det_out and the drain terminal 408D of the transistor 408. The gate terminal 434G is coupled to the path 436 carrying the vbiasN voltage. The source terminal 434S is coupled to the SW path 326 and the source terminal 432S of the transistor 432. As similarly noted in describing FIG. 2, while FIG. 3 does not depict an input circuit for driving the gate terminal 322G of the low-side FET 322, an illustrative circuit for driving the gate terminal 322G is provided below with respect to FIG. 6.

In one example of the operation of the pin-short detection circuit 330, a pin short does not exist between the SW pin 214 and the GND pin 212, so the power converter IC package 206 operates in the normal (or primary) operation mode. In this mode, the switching of the high-side FET 320 is driven by the clock signal on the Clk path 304. When the high-side FET 320 is switched on, the signal SW is pulled up to approximate the voltage signal VIN. With the gate terminal 432G coupled to the drain terminal 432D, the transistor 432 performs as a diode-connected transistor and a drain-to-source voltage (VDS) is equivalent to a voltage threshold (VT) of the transistor 432. The signal SW is thus amplified, or increased, at the drain terminal 432D by the VT of the transistor 432. Similarly, since the gate terminal 430G and the drain terminal 430D of the transistor 430 are coupled, a voltage at the drain terminal 430D increases the voltage at the drain terminal 432D, this time by a VT of the transistor 430, such that the resulting amplified signal SW at the drain terminal 430D is the original signal SW on the SW path 326 plus the VT of the transistor 432 plus the VT of the transistor 430. In this manner, the transistors 430, 432 can be considered multiple bias transistors configured to amplify the signal SW. With the high-side FET 320 operating normally, the signal hsfg, which is coupled to the gate terminal 320G of the high-side FET 320, is sufficiently high to turn on the transistor 426. The amplified signal SW propagates through the transistor 426, so the signal swsen at the swsen path 424 is the amplified signal SW present at the drain terminal 430D.

Furthermore, since the signal SW is pulled up to the voltage signal VIN when the high-side FET 320 is on, the signal CB, which is a voltage of the signal SW plus the voltage across the bootstrap capacitor 202 coupled to the CB pin 210 and the SW pin 214 (FIG. 1), is pulled up above the voltage signal VIN. The gate terminal 404G driven by the signal CB switches on the transistor 404 and the voltage signal VIN propagates through the transistor 404, such that the signal vinsen on the vinsen path 420 approximates the voltage signal VIN. For the transistor 410 to turn on, a voltage at the gate terminal 410G should exceed a voltage at the source terminal 410S by a threshold voltage (VT) of the transistor 410. Because the voltage at the gate terminal 410G is the voltage signal VIN and a voltage of the signal swsen at the source terminal 410S is the amplified signal SW described above, and further because the original signal SW on the SW path 326 approximates the voltage signal VIN, then the voltage at the gate terminal 410G does not exceed the voltage at the source terminal 410S by VT and the transistor 410 is off. In this manner, the transistor 410 effectively behaves as a comparator that compares the signals vinsen and swsen and, depending on the comparison, either switches on or off, thus affecting the status of the signal det_in (and, ultimately, of the signal det_out), as explained below.

With the transistor 410 off, the signal det_in will be determined by the transistor 406. The path 414 carries the vbiasP voltage to drive the gate terminal 406G of the transistor 406. Since the transistor 406 is in some examples a p-channel MOSFET, for a bias current (Ib) 412 to flow through the transistor 406, vbiasP should be lower than the signal CB by at least a VT of the transistor 406. Accordingly, in some examples, vbiasP is fixed at a voltage sufficiently low to keep the transistor 406 turned on. With the transistor 406 on, the signal det_in on the det_in path 416 approximates the signal CB, which is high. Since, in some examples, the transistor 408 is also a p-channel MOSFET, for the transistor 408 to turn on, a voltage at the gate terminal 408G should be lower than a voltage at the source terminal 408S by at least a VT of the transistor 408. Since the voltage at the gate terminal 408G and the voltage at the source terminal 408S are equivalent to the signal CB, the transistor 408 is off.

With the transistor 408 off, the signal det_out on the output path 308 is determined by the transistor 434. The path 436 carries the vbiasN voltage to drive the gate terminal 434G of the transistor 434. Since the transistor 434 is in some examples an n-channel MOSFET, for a bias current (Ib) 412 to flow through the transistor 434, vbiasN should be higher than the signal SW by at least a VT of the transistor 434. Accordingly, in some examples, vbiasN is fixed at a voltage that is sufficiently high to keep the transistor 434 turned on. With the transistor 434 switched on, the signal det_out on the output path 308 is pulled low, since the transistor 408 is off. The low signal det_out indicates there is no pin short between the SW pin 214 and the GND pin 212. While in the primary (or normal) operation mode, if the high-side FET 320 switches off in accordance with the clock signal on the Clk path 304 or the operation of the blanking circuit 332 (FIG. 2), the transistor 410 remains off because the signal swsen is higher than the signal vinsen, and so the signal det_out on the output path 308 is kept low.

As demonstrated by the above discussion, the transistors 406 and 434 should be kept on for the pin-short detection circuit 330 to generate the signal det_out. Therefore, vbiasP should be calculated to be lower than the signal CB by at least a VT of the transistor 406 and vbiasN should be calculated to be higher than the signal SW by at least a VT of the transistor 434. Since transistors 406, 434 are useful to the operation of the circuit and use a bias voltage to drive the gate terminals 406G, 434G, respectively, each will herein be referred to as a bias transistor. The bias transistor 406 provides a first bias current to control operation of the transistor 408 based on the signal det_in. The bias transistor 434 provides a second bias current to drive the signal det_out based on the signal det_in.

In another example of the operation of the pin-short detection circuit 330, a pin short exists between the SW pin 214 and the GND pin 212 (pin-short operation mode). When the high-side FET 320 is switched on by the operation of the clock signal on the Clk path 304, the signal SW will not be pulled up to the voltage signal VIN because of the short of the SW pin 214 to the GND pin 212. As explained in the previous example, the transistors 430, 432 perform as diode-connected transistors and the VDSs are equivalent to the VTs of the transistors 430, 432, respectively. Because the signal SW is pulled to GND, the voltage at the drain terminal 432D approximates the VT of the transistors 432. A voltage at the drain terminal 430D approximates the VT of the transistor 432 plus the VT of the transistor 430. With the high-side FET 320 on, the signal hsfg, which is coupled to the gate terminal 320G of the high-side FET 320, is sufficiently high to turn on the transistor 426. The amplified signal SW propagates through the transistor 426, so the signal swsen on the swsen path 424 approximates the voltage at the drain terminal 430D.

The signal CB is equivalent to the voltage of signal SW plus the voltage across the bootstrap capacitor 202, which is coupled between the CB pin 210 and the SW pin 214. Since the signal SW is pulled down to GND when the high-side FET 320 is on, the signal SW is zero volts, and so the signal CB is the voltage across the bootstrap capacitor 202 (FIG. 1). The gate terminal 404G driven by the signal CB operates the transistor 404 in a saturation region and the signal vinsen on the vinsen path 420 approximates CB minus a VT of the transistor 404. As discussed in the previous example, for the transistor 410 to turn on, the voltage of the signal vinsen should exceed the voltage of the signal swsen by the VT of the transistor 410. Because the voltage at the gate terminal 410G is CB minus the VT of the transistor 404 and the signal swsen at the source terminal 410S is the sum of the VTs of the transistors 430, 432, then the voltage at the gate terminal 410G is greater than the voltage at the source terminal 410S and the transistor 410 is on.

With the transistor 410 on, the signal det_in is determined by the drain voltage 410D of the transistor 410, or the signal vinsen minus the signal swsen minus a VT of the transistor 410. Though the signal det_in is pulled high, the value is less than the signal CB (CB minus the VT of the transistor 404 minus the sum of the VTs of the transistors 430, 432). As described in the previous example, since the transistor 408 is a p-channel MOSFET, for the transistor 408 to turn on, the voltage at the gate terminal 408G should be lower than the voltage at the source terminal 408S, which is the voltage of the signal CB, by at least the VT of the transistor 408. Since the voltage at the gate terminal 408G is less than the signal CB, the transistor 408 is on. With transistor 408 on, the signal det_out on the output path 308 is determined by a voltage at the drain terminal of the transistor 408, so the signal det_out is pulled high to indicate a pin short is detected.

As demonstrated by the discussion above, the result of the comparison performed by the transistor 410 of the signal vinsen and the signal swsen generates the signal det_in. Based on a value of the signal det_in, the transistor 408 either switches on or off, so the signal det_in at the non-control terminal 410D of the transistor 410 is referred to as a reference signal. Furthermore, a value of the reference signal can be referred to as having either a first state indicating the primary operation mode or a second state indicating the pin-short operation mode. The signal det_out is then determined by the reference signal, as it controls the operation of the transistor 408. The value of the output signal det_out also has either a first state indicating the primary operation mode or a second state indicating the pin-short operation mode.

Figure 4:
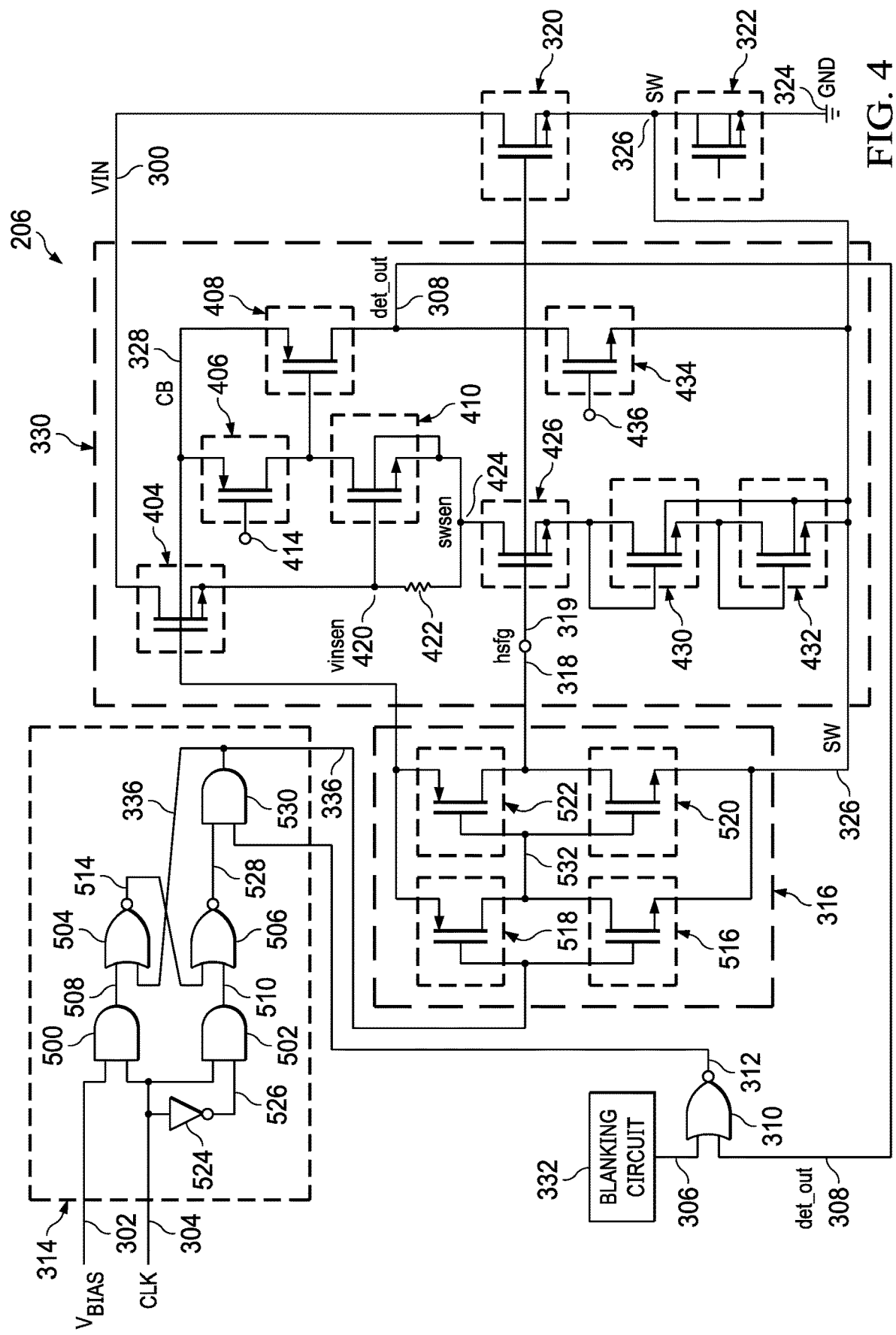
FIG. 4 depicts a schematic diagram of a power converter IC package containing a pin-short detection circuit, in accordance with various examples.

FIG. 4 depicts a schematic diagram of the power converter IC package 206 containing the pin-short detection circuit 330, in accordance with various examples. In some examples, the power converter IC package 206 includes the blanking circuit 332, the NOR gate 310, the D flip-flop 314, the buffer 316, the pin-short detection circuit 330, the high-side FET 320, and the low-side FET 322 (FIG. 2). In further examples, the D flip-flop 314 includes an inverter 524, an AND gate 500, an AND gate 502, a NOR gate 504, a NOR gate 506, and an AND gate 530. In some examples, the buffer 316 includes a transistor 516, a transistor 518, a transistor 520, and a transistor 522. In further examples, the transistors 518, 522 are pMOSFETs or PMOS, and the FETs 516, 520 are nMOSFETs or NMOS. While FIG. 4 does not depict a circuit for driving the low-side FET 322, FIG. 6 depicts an illustrative circuit for driving the low-side FET 322.

The power converter IC package 206 includes multiple paths. The path 306 couples the output from the blanking circuit 332 to an input of the NOR gate 310 (FIG. 2). The output path 308 carries the signal det_out from the pin-short detection circuit 330 and couples to an input of the NOR gate 310. The output path 312 couples an output from the NOR gate 310 to an input of the AND gate 530. The VBIAS path 302 carries the voltage bias VBIAS and is coupled to an input of the inverter 524 and an input of the AND gate 500. A path 526 couples an output of the inverter 524 to an input of the AND gate 502. The CLK path 304 carries the clock signal and couples to an input of the AND gate 500 and an input of the AND gate 502. A path 508 couples an output from the AND gate 500 and an input of the NOR gate 504. A path 510 couples an output from the AND gate 502 and an input of the NOR gate 506. A path 514 couples an output from the NOR gate 504 to an input of the NOR gate 506. A path 528 couples an output from the NOR gate 506 and an input of the AND gate 530. The output path 336 couples an output from the AND gate 530 to an input of the NOR gate 504 and to a shared input of the transistors 516, 518 configured as a first inverter of the buffer 316. A path 532 couples an output of the first inverter of the buffer 316 to a shared input of the transistors 520, 522 configured as a second inverter of the buffer 316. The output path 318 carries the signal hsfg and couples an output from the second inverter of the buffer 316 to the feedback path 319 and the high-side FET 320.

The operation of the power converter IC package 206 as depicted in FIG. 4 is now described. In some examples using the circuit of FIG. 4, VBIAS is high (and, in some examples, is kept high during both primary and pin-short operation modes) and the clock signal is high. With both inputs into the AND gate 500 high, the path 508 carries a high signal. A high signal as an input to the NOR gate 504 results in the path 514 carrying a low signal. With a high VBIAS input into the inverter 524, a signal on the path 526 is low. With the high clock signal and the low signal on the path 526 as inputs into the AND gate 502, a signal on the path 510 is low. With the low signals carried on paths 510, 514 as inputs to the NOR gate 506, a signal on the path 528 is high.

Assume now that the pin-short detection circuit 330 detects a short of the SW pin 214 to the GND pin 212 and asserts the signal det_out as a high on the output path 308. When an input signal, such as the signal det_out, of the NOR gate 310 is high, then the signal on the output path 312 is low. When an input signal, such as the signal on the output path 312, of the AND gate 530 is low, then an output signal on the output path 336 is low. In this manner, the output signal on the output path 312 can be thought of as driving a reset on low of the D flip-flop 314. The buffer 316 receives the low signal on the output path 336. Since the transistors 518, 516 are configured to invert the low signal on the output path 336, a signal on the path 532 is high. The transistors 522, 520 are configured to invert the signal on the path 532, so the signal hsfg on the output path 318 is low. As discussed in regards to FIG. 2, a low signal hsfg switches off the high-side FET 320 and stops the transmission of the signal SW along the SW path 326 to the SW pin 214 of the power converter IC package 206. This is referred to as the pin-short operation mode. The ability of the pin-short detection circuit 330 to stop the transmission of the signal SW during the pin-short operation mode is technically advantageous because it reduces the safety hazards of smoke and fire and helps mitigate electrical damage to the circuitry.

In another example using the circuit of FIG. 4, no pin short occurs between the SW pin 214 and the GND pin 212. In this scenario, the signal det_out will not be asserted as high. Thus, the signal on the output path 312 will be controlled by the blanking circuit 332. More specifically, when the blanking circuit 332 outputs a low signal, the signal on the output path 312 is high, and so the high-side FET 320 is controlled according to the clock input of the D flip-flop 314. When the blanking circuit 332 outputs a high signal, the signal on the output path 312 is low, and so the AND gate 530 is driven low, which, in turn, switches off the high-side FET 320. As discussed above in regards to FIG. 2, the specific timing and operational details of the blanking circuit 332 can be implemented as desired to achieve specific performance or noise elimination goals.

As mentioned above in discussing FIG. 2, while in some examples, the signal det_out is asserted as a high when the pin-short detection circuit 330 detects a pin-short event, the signal det_out could also be asserted as a low when the pin-short detection circuit 330 detects a pin-short event, as long as the subsequent logic circuitry, currently represented by the NOR gate 310 and the D flip-flop 314, is adjusted accordingly. For example, if the signal det_out is asserted as a low, the signal det_out could be an input to an inverter whose output then is an input to the NOR gate 310. This configuration should achieve the same output results as described above in the FIG. 4 examples.

Figure 5:
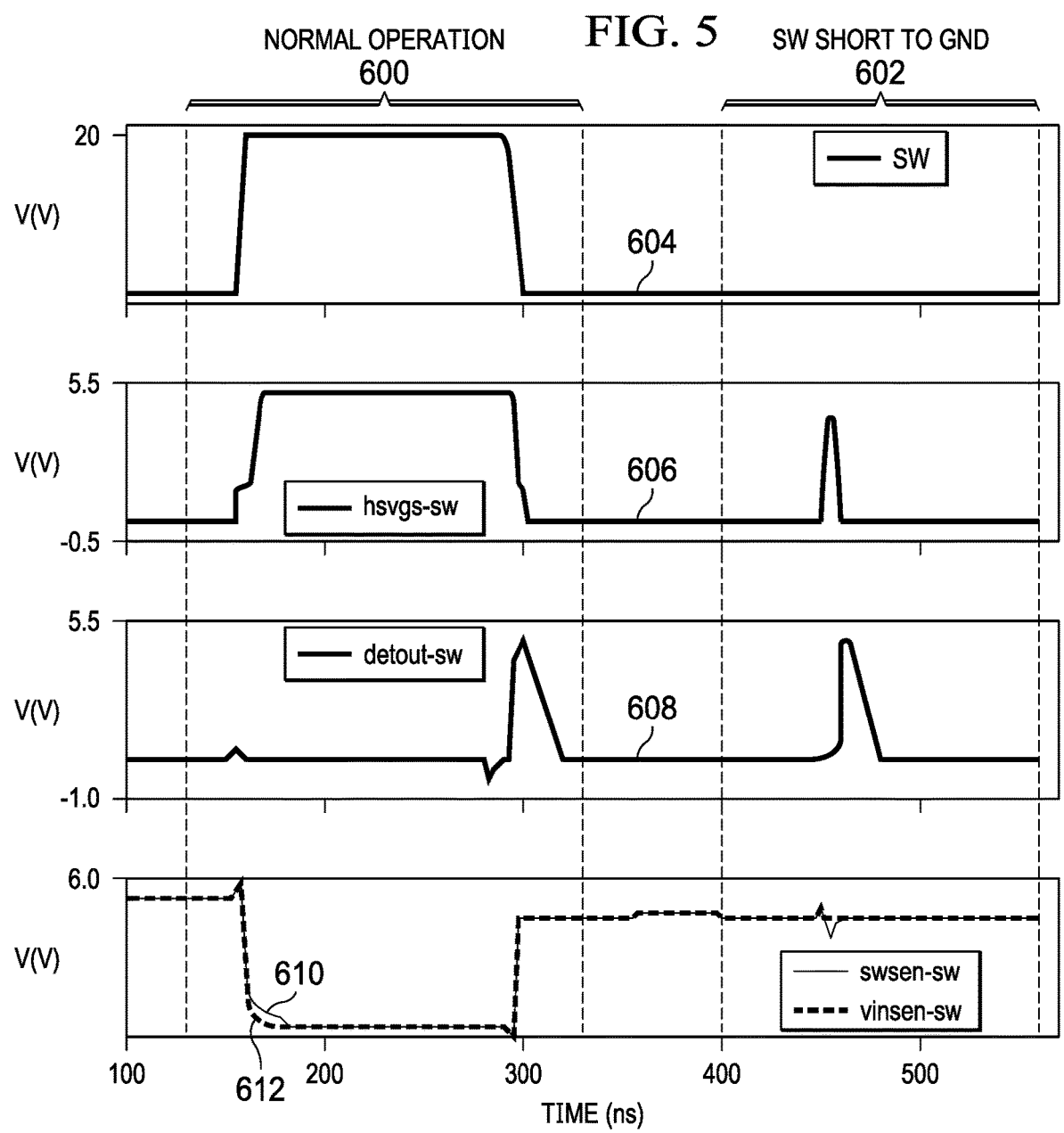
FIG. 5 depicts a timing diagram of the operation of a pin-short detection circuit, in accordance with various examples.

FIG. 5 depicts a timing diagram of the operations of the pin-short detection circuit 330, in accordance with various examples. The SW waveform 604 corresponds to a voltage signal SW on the SW path 326 (FIG. 2). The hsvgs-sw waveform 606 corresponds to a gate-to-source voltage (VGS) signal on the high-side FET 320. The detout-sw waveform 608 corresponds to a voltage signal on the output path 308. The swsen-sw waveform 610 corresponds to a voltage signal on the swsen path 424. The vinsen-sw waveform 612 corresponds to a voltage signal on the vinsen path 420. Because the signal det_out is determined by a comparison of the signal vinsen and the signal swsen, the two waveforms are presented on the same axis with the swsen-sw waveform 610 represented by a solid line and the vinsen-sw waveform 612 represented by a dotted line.

Referring to the waveforms of FIG. 5 along with FIGS. 3 and 4, initially, the power converter IC package 206 is in the primary operation mode, as indicated by numeral 600, in which no pin short between the SW pin 214 and the GND pin 212 exists. In primary, or normal, operation 600, the clock signal on the Clk path 304 drives the signal hsfg high, which switches on the high-side FET 320 for a fixed time interval, or approximately 150 ns in this example. For the high signal hsfg to turn on the high-side FET 320, the VGS of the high-side FET 320, which is approximately 5.5V in this example, should exceed a VT of the high-side FET 320. With the high-side FET 320 on, the voltage signal SW corresponds to a voltage signal on the VIN path 300, or approximately 20V in this example. With SW pulled to VIN, the signal vinsen should approximate or fall below the signal swsen so that the comparator transistor 410 is off. In this example, the swsen-sw waveform 610 and the vinsen-sw waveform 612 indicate that the signals swsen and vinsen are nearly identical or that the signal vinsen is slightly below the signal swsen, indicating that the transistor 410 is off. With transistor 410 off, the signal det_out on the output path 308 of the pin-short detection circuit 330 is low, as indicated by the detout-sw waveform 608. (While there is a brief spike on the detout-sw waveform around the 300 ns mark, the high-side FET 320 is already off, as indicated by the hsvgs-sw waveform 606. The brief spike is due to parasitic capacitance.)

Still referring to the waveforms of FIG. 5 along with FIGS. 3 and 4, when a short occurs between the SW pin 214 and the GND pin 212, the signal SW on output path 326 is low, as demonstrated by the negligible voltage in this example, which is indicated by numeral 602. Despite the short, the high-side FET 320 will still attempt to turn on due to the initial clock signal driving the signal hsfg, as demonstrated by the spike in the hsvgs-sw waveform 606. However, with the signal SW pulled to GND, the signal vinsen exceeds the signal swsen, as demonstrated at approximately 450 ns. The difference is sufficient enough so that the comparator transistor 410 switches on. With the transistor 410 on, the signal det_out goes high, as demonstrated in the time interval immediately subsequent to 450 ns. The high signal det_out drives the signal hsfg low, which switches off the high-side FET 320 with negligible delay. The minimum duration of on time for the high-side FET 320 during a pin-short event reduces the safety hazards of smoke and fire and helps mitigate electrical damage to the circuitry.

FIG. 6 depicts a schematic diagram of the contents of the power converter IC package 206, in accordance with various examples. In some examples, the power converter IC package 206 includes a blanking circuit 732, a pin-short detection circuit 730, a NOR gate 710, a D flip-flop 714, a buffer 716, the high-side FET 320, and the low-side FET 322. As described above in regards to FIG. 2, the blanking circuit 732 can be any circuit designed to reduce noise of a received signal 734. Illustrative details regarding the contents and functionality of the pin-short detection circuit 730 are provided below with respect to FIG. 7. In addition, while the power converter IC package 206 depicts the NOR gate 710 and the D flip-flop 714, the power converter IC package 206 can utilize any electronic circuit that performs an equivalent function to the NOR gate 710 and the D flip-flop 714, as discussed below with regard to FIG. 7.

In some examples, the gate terminal 322G of the low-side FET 322 is coupled to an output path 718 of the buffer 716 carrying a signal lsfg and a feedback path 719 of the pin-short detection circuit 730. The drain terminal 322D of the low-side FET 322 is coupled to the SW path 326, which, in turn, is coupled to the SW pin 214 of the power converter IC package 206 (FIG. 1). In this manner, the drain terminal 322D receives the voltage signal SW along the SW path 326. The source terminal 322S of the low-side FET 322 is coupled to the GND path 324, which, in turn, is coupled to the GND pin 212 of the power converter IC package 206 (FIG. 1). In this manner, the GND path 324 carries the signal GND. The source terminal 320S of the high-side FET 320 is also coupled to the SW path 326. The drain terminal 320D of the high-side FET 320 is coupled to the VIN path 300, which, in turn, is coupled to the VIN pin 216 of the power converter IC package 206. While FIG. 6 does not depict a circuit for driving the gate terminal 320G of the high-side FET 320, FIG. 2 depicts an illustrative circuit for driving the gate terminal 320G.

The pin-short detection circuit 730 includes multiple input paths, including the GND path 324 (which carries the signal GND), the SW path 326 (which carries the signal SW), the feedback path 719 (which carries the signal lsfg), and the CB path 328 (which carries the signal CB). The CB path 328 is coupled to the CB pin 210 of the power converter IC package 206 (FIG. 1). The pin-short detection circuit 730 has an output path 708 carrying a signal Isdet_out.

In some examples, the output path 708 and an output path 706 of the blanking circuit 732 are coupled to inputs of the NOR gate 710. An output path 712 of the NOR gate 710 is coupled to a reset input of the D flip-flop 714. The D flip-flop 714 also receives a clock signal Clk on a Clk path 704 and a voltage bias (VBIAS) on a VBIAS path 702 as clock and set, or D, inputs, respectively. An output path 736 of the D flip-flop 714 is coupled to an input of the buffer 716. As mentioned previously, the output path 718 of the buffer 716 is coupled to the gate terminal 322G of the low-side FET 322 as well as the feedback path 719 of the pin-short detection circuit 730.

In one example using the circuit of FIG. 6, when a pin short occurs between the SW pin 214 and the VIN pin 216, then the pin-short detection circuit 730 asserts the signal Isdet_out as a high. (As mentioned, the structural and functional details of the pin-short detection circuit 730 are provided below with respect to FIG. 7.) Because the signal Isdet_out is high, the signal on the output path 712 of the NOR gate 710 is low. When the reset input of the D flip-flop 714 receives a low signal, the signal on the output path 736 of the D flip-flop 714 is set to low regardless of the other inputs of the D flip-flop 714. (The structural and functional details of the operation of the D flip-flop 714 are provided below with respect to FIG. 7.) If the signal on the output path 736 is low, then the signal lsfg, after passing through the buffer 716, is also low. A low signal at the gate terminal 322G switches off the low-side FET 322. As a result of the off state of the low-side FET 322, no signal SW is transmitted along the SW path 326 to the SW pin 214 of power converter IC package 206, thus advantageously preventing smoke and fire and mitigating damage to the circuitry. This is the pin-short operation mode.

In another example using the circuit of FIG. 6, no pin short occurs between the SW pin 214 and the VIN pin 216. In this scenario, the signal Isdet_out will not be asserted high. The signal on the output path 712 of the NOR gate 710 will be controlled by the blanking circuit 732. More specifically, if the blanking circuit 732 outputs a low signal, the signal on the output path 712 is high, and so the low-side FET 322 is controlled according to the clock signal on the Clk path 704. When the blanking circuit 732 outputs a high signal, the signal on the output path 712 is low, and so the low-side FET 322 is turned off. The specific timing and operational details of the blanking circuit 732 can be implemented as desired to achieve specific performance or noise elimination goals. When the operation of a power transistor is controlled by the clock signal on the Clk path 704 or the blanking circuit 732, this operation is referred to as the normal operation mode (also occasionally referred to herein as the primary operation mode).

While in this discussion, the signal Isdet_out is asserted as a high when the pin-short detection circuit 730 detects a pin-short event, the signal Isdet_out could also be asserted as a low when the pin-short detection circuit 730 detects a short as long as the subsequent logic circuitry, currently represented by the NOR gate 710 and the D flip-flop 714, is adjusted accordingly. (For an example, see discussion below in regards to FIG. 7.) When the pin-short detection circuit 730 detects a pin-short event, regardless of whether the signal Isdet_out is asserted as a high or as a low, the state is the pin-short operation mode. In some examples, in response to the signal Isdet_out indicating the pin-short operation mode, the signal lsfg is driven low, which, in turn, switches off the low-side FET 322.

Figure 7:
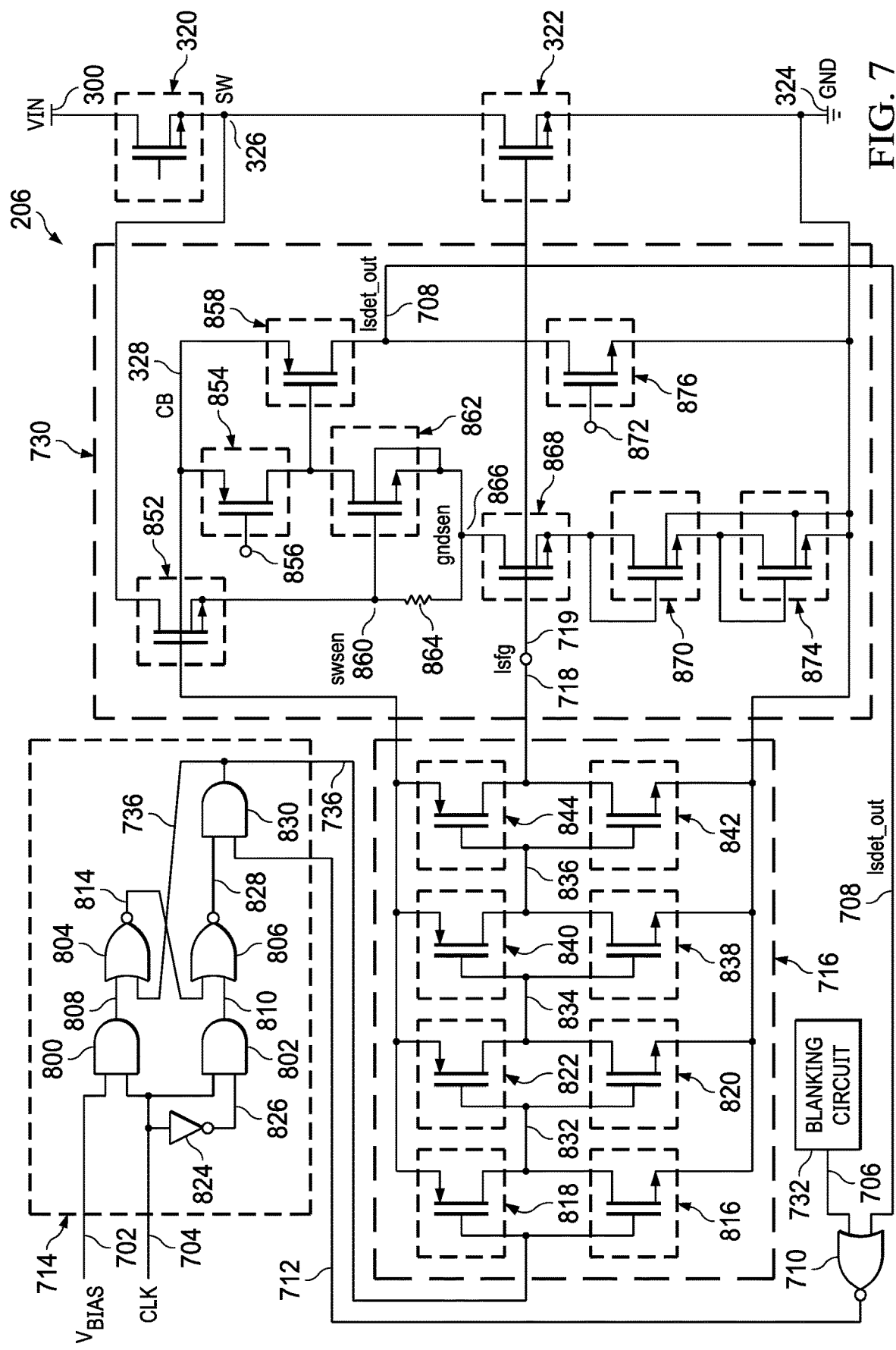
FIG. 7 depicts a schematic diagram of a power converter IC package containing a pin-short detection circuit, in accordance with various examples.

FIG. 7 depicts a schematic diagram of the power converter IC package 206 containing the pin-short detection circuit 730, in accordance with various examples. In some examples, the power converter IC package 206 includes the blanking circuit 732, the NOR gate 710, the D flip-flop 714, the buffer 716, the pin-short detection circuit 730, the high-side FET 320, and the low-side FET 322. In some examples, the D flip-flop 714 includes an inverter 824, an AND gate 800, an AND gate 802, a NOR gate 804, a NOR gate 806, and an AND gate 830. In further examples, the buffer 716 includes a transistor 816, a transistor 818, a transistor 820, a transistor 822, a transistor 838, a transistor 840, a transistor 842, and a transistor 844. In some examples, the pin-short detection circuit 730 includes a transistor 852, a transistor 854, a transistor 858, a transistor 862, a transistor 868, a transistor 870, a transistor 874, and a transistor 876. In further examples, the transistors 816, 818, 820, 822, 838, 840, 842, 844, 852, 854, 858, 862, 868, 870, 874, 876 are FETs. In one example, the FETs 818, 822, 840, 844, 854, 858 are pMOSFETs or PMOS, and the FETs 816, 820, 838, 842, 852, 862, 868, 870, 874, 876 are nMOSFETs or NMOS. In yet further examples, the FETs 852, 868 are high-voltage FETs. While FIG. 7 does not depict a circuit for driving the high-side FET 320, FIG. 2 discussed above depicts an illustrative circuit for driving the high-side FET 320.

In some examples, the D flip-flop 714 is configured similarly to the D flip-flop 314 in that paths 808, 810, 814, 826, 828 couple to the logic gates 800, 802, 804, 806, 830 in the same manner as the paths 508, 510, 514, 526, 528 couple to the logic gates 500, 502, 504, 506, 530 (FIG. 4). In further examples, the pin-short detection circuit 730 is configured similarly to the pin-short detection circuit 330 in that the transistors 852, 854, 858, 862, 868, 870, 874, 876 are coupled to each other in the same manner as the transistors 404, 406, 408, 410, 426, 430, 432, 434 are coupled to each other (FIG. 3). However, because the pin-short detection circuit 730 is configured to drive the low-side FET 322, the paths of the D flip-flop 714 of FIG. 7 differ from the paths of the D flip-flop 314 of FIG. 4 in the following ways. The VBIAS path 702 replaces the VBIAS path 302. The clock signal on the Clk path 704 replaces the clock signal on the Clk path 304. The output path 736, coupling an output from the AND gate 830, an input of the NOR gate 804, and a shared input of the transistors 816, 818 configured as a first inverter of the buffer 716, of FIG. 7 replaces the output path 336 of FIG. 3. Furthermore, the paths of the pin-short detection circuit 730 of FIG. 7 differ from the paths of the pin-short detection circuit 330 of FIG. 3 in the following manner. The GND path 324 of FIG. 7 replaces the SW path 326 of FIG. 3. The SW path 326 of FIG. 7 replaces the VIN path 300 of FIG. 3. A gndsen path 866 of FIG. 7 replaces the swsen path 424 of FIG. 3. A swsen path 860 of FIG. 7 replaces the vinsen path 420 of FIG. 3. The output path 708 carrying the signal Isdet_out of FIG. 7 replaces the output path 308 carrying the signal det_out signal of FIG. 3. A path 856 carrying a vbiasP voltage replaces the path 414 of FIG. 3, and a path 872 carrying a vbiasN voltage replaces the path 436 of FIG. 3.

In further examples, the buffer 716 comprises four inverters. A path 832 couples an output of the first inverter of the buffer 716 and a shared input of the FETs 820, 822 configured as a second inverter of the buffer 716. A path 834 couples an output from the second inverter of the buffer 716 and a shared input of the FETs 838, 840 configured as a third inverter of the buffer 716. A path 836 couples an output of the third inverter of the buffer 716 and a shared input of the FETs 842, 844 configured as a fourth inverter of the buffer 716. The output path 718 carries the signal lsfg and couples an output from the fourth inverter of the buffer 716, the feedback path 719 of the pin-short detection circuit 730, and the low-side FET 322.

The operation of the power converter IC package 206 as depicted in FIG. 7 is now described. In some examples using the circuit of FIG. 7, VBIAS is high (and, in some examples, is kept high during both primary and pin-short operation modes) and the clock signal is high. With both inputs into the AND gate 800 high, the path 808 carries a high signal. A high signal as an input to the NOR gate 804 results in the path 814 carrying a low signal. With a high VBIAS input into the inverter 824, a signal on the path 826 is low. With the high clock signal and the low signal on the path 826 as inputs into the AND gate 802, a signal on the path 810 is low. With the low signals carried on paths 810, 814 as inputs, the signal 828 of the NOR gate 806 is high.

Assume now, no pin short occurs between the SW pin 214 and the VIN pin 216. In this scenario, the low-side FET 322 is switched on by the clock signal on the Clk path 704, and the signal SW is pulled low to GND. The FETs 870, 874, acting as multiple bias transistors, perform as diode-connected transistors so that the voltage on the gndsen path 866 approximates the sum of the VTs of the FETs 870, 874. (See FIG. 3 for a complete description of the structure and functionality of bias transistors, e.g., the multiple bias transistors 430, 432.) Furthermore, with the signal SW pulled low to GND, the voltage on the swsen path 860 approximates GND. Since the signal swsen is less than the signal gndsen, the comparator transistor 868 is off. (See FIG. 3 for a complete description of the structure and functionality of comparator transistors, e.g., the comparator transistor 410.) Since the comparator transistor 868 is off, the transistor 858 is off, and the signal Isdet_out is asserted as a high. (See FIG. 3 for a complete description of the structure and functionality of the driving of the transistor 408 and generation of the signal det_out.) Thus, the signal on the output path 712 will be controlled by the blanking circuit 732. More specifically, when the blanking circuit 732 outputs a low signal, the signal on the output path 712 is high, and so the low-side FET 322 is controlled according to the clock signal of the D flip-flop 714. When the blanking circuit 732 outputs a high signal, the signal on the output path 712 is low, and so the AND gate 830 is driven low, which, in turn, switches off the low-side FET 322. As discussed above in regards to FIG. 6, the specific timing and operational details of the blanking circuit 732 can be implemented as desired to achieve specific performance or noise elimination goals. When either the blanking circuit 732 or the clock signal of the D flip-flop 714 controls the operation of the low-side FET 322, it is referred to as the primary operation mode.

In another example, the pin-short detection circuit 730 detects a short between the SW pin 214 and the VIN pin 216. When the low-side FET 322 is switched on by the clock signal on the Clk path 704, the signal SW will not be pulled low to GND because of the short of the SW pin 214 to the VIN pin 216. The multiple bias transistors 870, 874, performing as diode-connected transistors, amplify the signal GND so that the voltage on the gndsen path 866 approximates the VTs of the FETs 870, 874. Furthermore, since the signal SW is pulled up to VIN and the signal CB is the voltage across the bootstrap capacitor 202 plus the signal SW, the transistor 852 is on and the voltage on the swsen path 860 approximates the signal VIN. Since the signal swsen exceeds gndsen by more than the VT of the transistor 868, the comparator transistor 868 switches on. As a result of the transistor 868 switching on, the transistor 858 will also switch on and the signal Isdet_out is asserted as a high on the output path 708. When an input signal, such as the signal Isdet_out, of the NOR gate 710 is high, then the signal on the output path 712 is low. When an input signal, such as the signal on the output path 712, of the AND gate 830 is low, then an output signal on the output path 736 is low. In this manner, the output signal on the output path 712 can be thought of as driving a reset on low of the D flip-flop 714. The buffer 716 receives the low signal on the output path 736. Since the FETs 816, 818 are configured to invert the signal on the output path 736, a signal on the path 832 is high. The FETs 820, 822 are configured to invert the signal on the path 832, so a signal on the path 834 is low. Since the FETs 838, 840 are configured to invert the signal on the output path 834, a signal on the path 836 is high. The FETs 842, 844 are configured to invert the signal on the path 836, so the signal lsfg on the output path 718 is low.

As discussed in regards to FIG. 6, a low signal lsfg switches off the low-side FET 322 and stops the transmission of the signal SW along the SW path 326 to the SW pin 214 of the power converter IC package 206. This is referred to as the pin-short operation mode. The ability of the pin-short detection circuit 730 to switch off the low-side FET 322 during a pin-short event advantageously reduces the likelihood of smoke and fire and stops the propagation of the signal SW, helping to mitigate electrical damage to the circuitry.

As mentioned above in discussing FIG. 6, while in some examples, the signal Isdet_out is asserted as a high when the pin-short detection circuit 730 detects a pin-short event, the signal Isdet_out could also be asserted as a low when the pin-short detection circuit 850 detects a pin-short event, as long as the subsequent logic circuitry, currently represented by the NOR gate 710 and the D flip-flop 714, is adjusted accordingly. For example, if the signal Isdet_out is asserted as a low, the signal Isdet_out could be an input to an inverter whose output then is an input to the NOR gate 710. This configuration should achieve the same output results as described above in the FIG. 6 examples.

Figure 8:
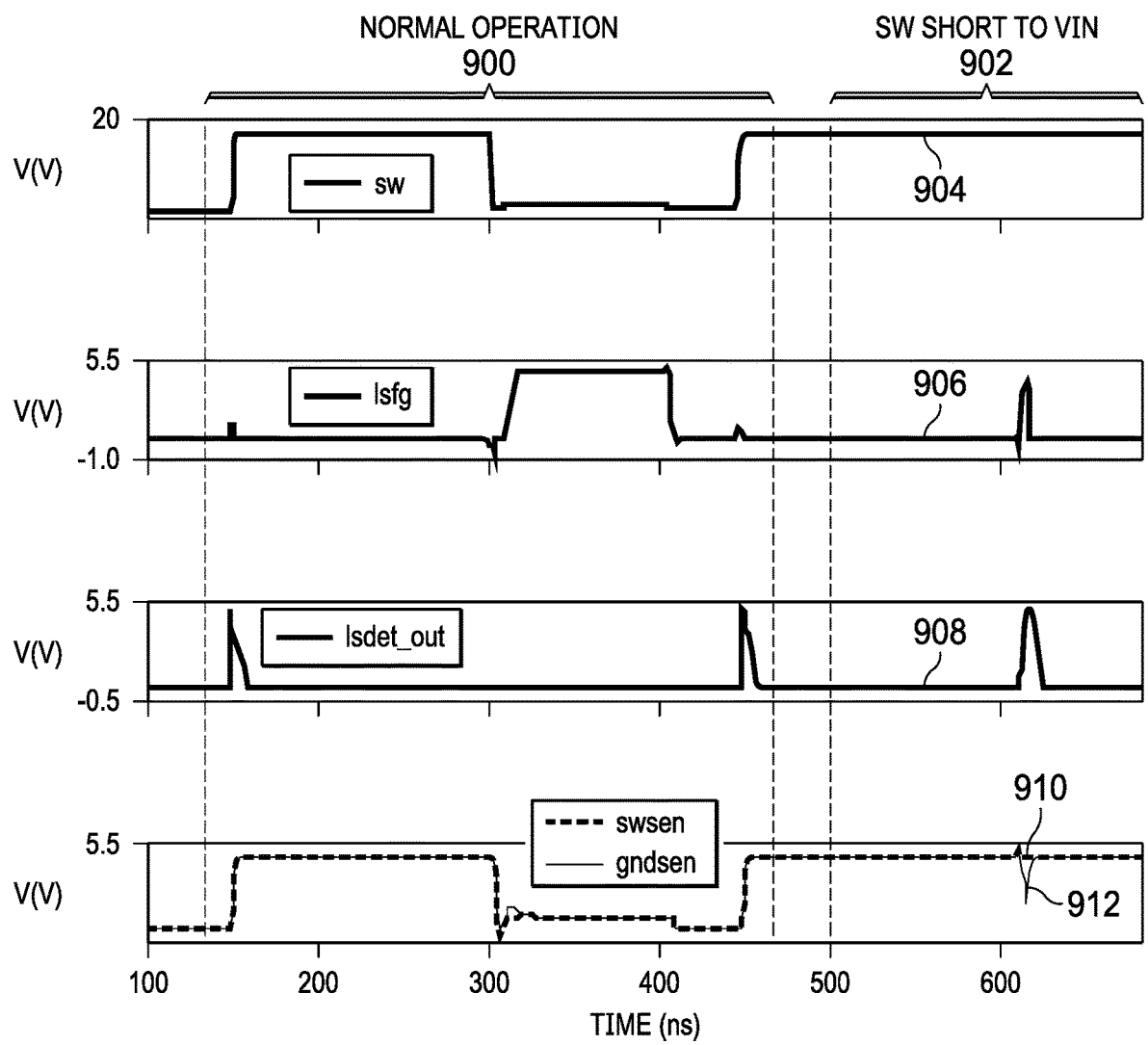
FIG. 8 depicts a timing diagram of the operation of a pin-short detection circuit, in accordance with various examples.

FIG. 8 depicts a timing diagram of the operation of the pin-short detection circuit 730, in accordance with various examples. The SW waveform 904 corresponds to a voltage signal SW on the SW path 326 (FIG. 6). The lsfg waveform 906 corresponds to a gate-to-source voltage (VGS) signal on the low-side FET 322. The Isdet_out waveform 908 corresponds to a voltage signal on the output path 708. The swsen waveform 910 corresponds to a voltage signal on the swsen path 860. The gndsen waveform corresponds to a voltage signal on the gndsen path 866. Because the signal Isdet_out is determined by a comparison of the signal swsen and the signal gndsen, the two waveforms are presented on the same axis with the signal gndsen represented by a solid line and the signal swsen represented by a dotted line.

Referring to the waveforms of FIG. 8 along with FIGS. 6 and 7, initially, the power converter IC package 206 is in the primary operation mode, as indicated by numeral 900, in which no pin short between the SW pin 214 and the VIN pin 216 exists. In primary, or normal, operation 900, the clock signal first switches on the high-side FET 320 for a fixed time interval, or approximately 150 ns in this example, prior to the low-side FET 322 switching on. While the high-side FET 320 is on, the low-side FET 322 is off, and the signal lsfg should be low, as demonstrated during the initial 150 ns of primary operation 900. After the high-side FET 320 switches off, the clock signal drives the signal lsfg high, which switches on the low-side FET 322 for a fixed time interval, or approximately 150 ns in this example. For the high signal lsfg to turn on the low-side FET 322, the VGS, which is approximately 5.5V in this example, should exceed a threshold voltage of the low-side FET 322. With no pin short, the signal swsen should approximate or fall below the signal gndsen so that the comparator transistor 862 is off and the signal Isdet_out is low. The voltage signal SW corresponds to a voltage signal on the SW path 326, or approximately 20V in this example. With the signal SW pulled to VIN, the signal vinsen should approximate or fall below the signal swsen so that the comparator transistor 862 is off. In this example, the swsen waveform 910 and the gndsen waveform 912 indicate that the signal swsen and the signal gndsen are nearly identical or that the signal swsen is slightly below the signal gndsen, indicating that the transistor 862 is off. With the transistor 862 off, the signal Isdet_out on the output path 308 of the pin-short detection circuit 730 is low, as indicated by the Isdet_out waveform 908. (While there are two brief spikes on the Isdet_out waveform 908, one at approximately 150 ns and one at approximately 450 ns, the low-side FET 322 is off during these periods, as indicated by the lsfg waveform 906. The brief spikes are due to parasitic capacitance.)

Still referring to the waveforms of FIG. 8 along with FIGS. 6 and 7, when a short occurs between the SW pin 214 and the VIN pin 216, the signal SW on path 326 is high, as demonstrated by the 20V in this example, which is indicated by numeral 902. Despite the short, the low-side FET 322 will still attempt to turn on due to the initial clock signal driving the signal lsfg, as demonstrated by the spike in the lsfg waveform 906. However, with the signal SW pulled to VIN, the signal swsen exceeds the signal gndsen, as demonstrated at approximately 625 ns. The difference is sufficient enough so that the comparator transistor 862 switches on. With the transistor 862 on, the signal Isdet_out goes high, as demonstrated in the time interval immediately subsequent to 625 ns. The high signal Isdet_out drives the signal lsfg low, which switches off the low-side FET 322 with negligible delay. The minimum duration of on time for the low-side FET 322 during a pin-short event reduces the safety hazards of smoke and fire and helps mitigate electrical damage to the circuitry.

Figure 9:
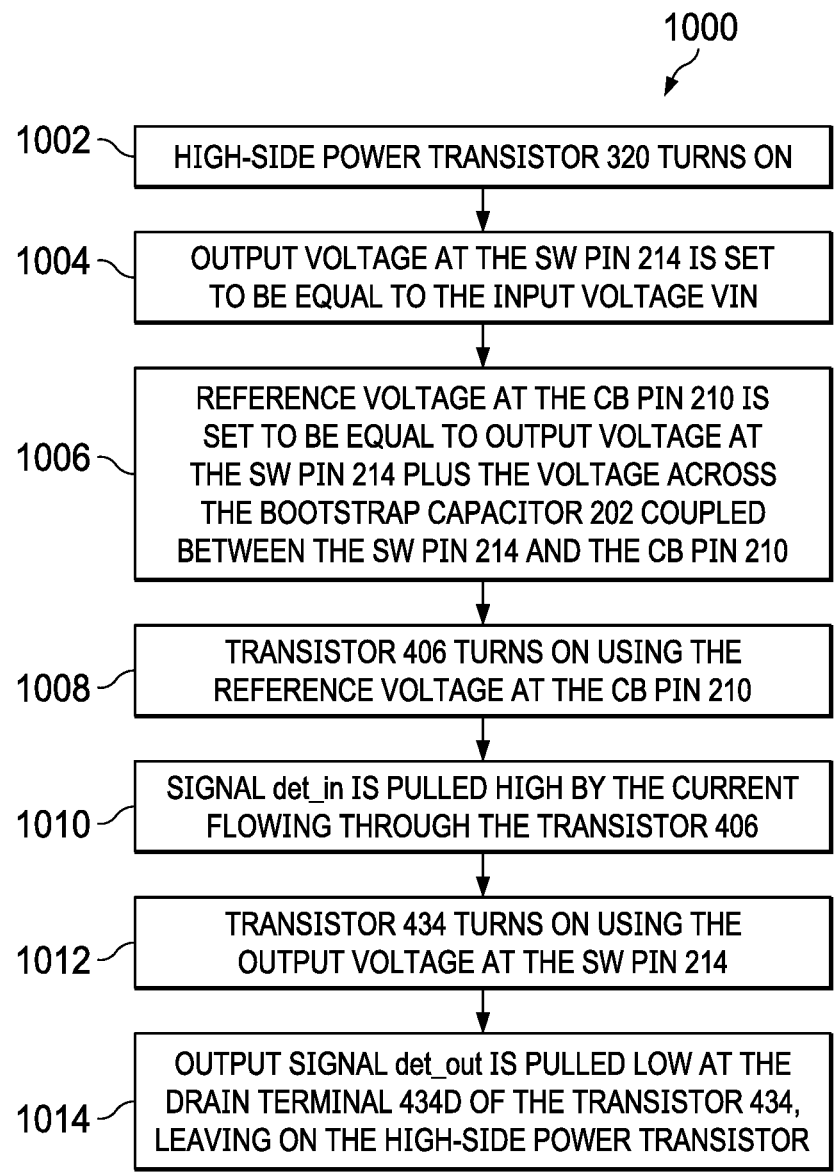
FIG. 9 depicts a flowchart of the operation of a pin-short detection circuit of a power converter IC package during a primary operation mode, in accordance with various examples.

FIG. 9 depicts a flowchart 1000 of the operation of the pin-short detection circuit 330 of the power converter IC package 206 during the primary operation mode, in accordance with various examples. The high-side power transistor 320 turns on (1002). An output voltage at the SW pin 214 is set to be equal to an input voltage VIN (1004). A reference voltage at the CB pin 210 is set to be equal to the output voltage at the SW pin 214 plus the voltage across a bootstrap capacitor 202 coupled between the CB pin 210 and the SW pin 214 (1006). The transistor 406 turns on using the reference voltage at the CB pin 210 (1008). The signal det_in is pulled high by current flowing through the transistor 406 (1010). The transistor 434 is turned on using the output voltage at the SW pin 214 (1012). The output signal det_out is pulled low at the drain terminal 434D of the transistor 434, leaving on the high-side power transistor 320 (1014).

In various examples, the transistors 406, 434 are bias transistors configured to enable the flow of bias currents. In some examples, the transistor 410 is off and the transistor 406 is configured to drive the gate terminal 408G of the transistor 408. With the signal det_in pulled high by the bias current flowing through the transistor 408, the transistor 408 remains off. The transistor 434 is configured to carry the output signal det_out. With the transistor 408 off, the bias current of the transistor 434 is configured to carry a low output signal det_out.

Figure 10:
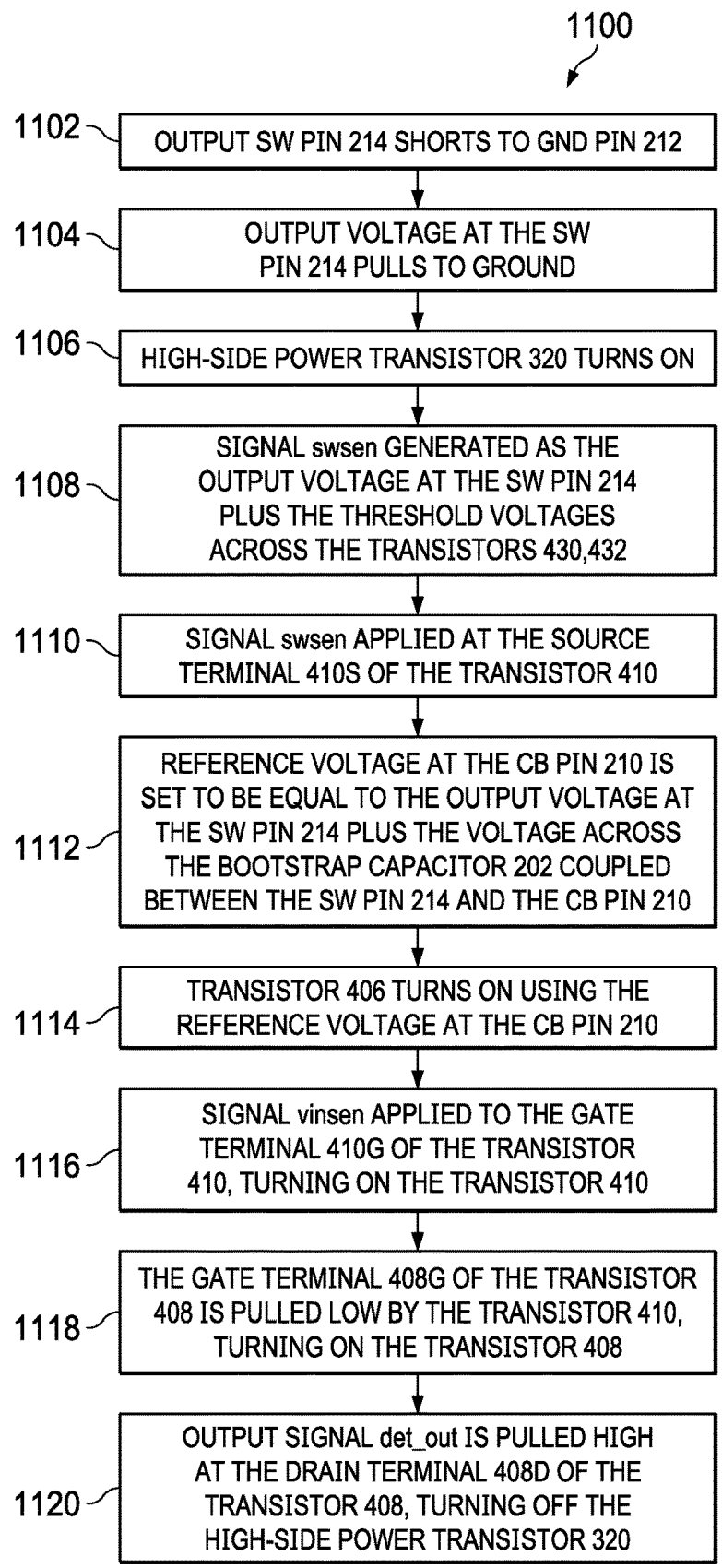
FIG. 10 depicts a flowchart of the operation of a pin-short detection circuit of a power converter IC package during a pin-short operation mode, in accordance with various examples.

FIG. 10 depicts a flowchart 1100 of the operation of the pin-short detection circuit 330 of the power converter IC package 206 during a pin-short operation mode, in accordance with various examples. The output SW pin 214 shorts to the GND pin 212 (1102). The output voltage at the SW pin 214 pulls to ground (1104). The high-side power transistor 320 turns on (1106). The signal swsen is generated as the output voltage at the SW pin 214 plus the threshold voltages across transistors 430, 432 (1108). The signal swsen is applied at the source terminal 410S of the transistor 410 (1110). The reference voltage at the CB pin 210 is set to be equal to the output voltage at the SW pin 214 plus the voltage across the bootstrap capacitor 202 coupled between the CB pin 210 and the SW pin 214 (1112). The transistor 406 turns on using the reference voltage at the CB pin 210 (1114). The signal vinsen is applied to the gate terminal 410G of the transistor 410, turning on the transistor 410 (1116). The gate terminal 408G of the transistor 408 is pulled low by the transistor 410, turning on the transistor 408 (1118). The output signal det_out is pulled high at the drain terminal 408D of the transistor 408, turning off the high-side power transistor 320 (1120). In this manner, the pin-short detection circuit 330 reduces the safety hazards of smoke and fire and mitigates electrical damage.

In some examples, the transistors 430, 432 act as amplifiers of the signal swsen. The transistor 430 is configured to amplify the signal swsen by the threshold voltage of the transistor 430 to generate a first amplified signal. The transistor 432 is configured to amplify the first amplified signal by the threshold voltage of the transistor 432 to generate a second amplified signal that is the signal swsen amplified by the threshold voltages of transistors 430, 432. In further examples, the transistor 410 is configured to act as a comparator that compares the signals vinsen and the signal swsen amplified. Depending on the results of the comparison, the transistor 410 either switches on or off, thus affecting the status of the signal det_in. Based on the value of the signal det_in, the transistor 408 either switches on or off, so the signal det_in at the non-control terminal 410D of the transistor 410 is referred to as a reference signal. The output signal det_out is then determined by the reference signal, as it controls the operation of the transistor 408.

In the foregoing discussion, the terms "including" and "comprising" are used in an open-ended fashion, and thus should be interpreted to mean "including, but not limited to . . . ." The term "couple" is used throughout the specification and claims. The term may cover connections, communications, or signal paths that enable a functional relationship consistent with the description of the present disclosure. For example, if device A generates a signal to control device B to perform an action, device A couples to device B. Similarly, devices A and B may be said to couple to each other if there is an intervening component C (or multiple such intervening components) between devices A and B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
an input voltage terminal;
a power converter integrated circuit (IC) package fuselessly coupled to the input voltage terminal and comprising:
first and second package terminals configured to receive first and second signals, respectively;
a transistor having first and second current terminals and a control terminal, the first current terminal coupled to the first package terminal, the control terminal coupled to the second package terminal, and the second current terminal configured to provide a reference signal responsive to the first and second signals, the reference signal having either a first state or a second state; and
a load circuit coupled to the power converter IC package.

2. The system of claim 1, wherein the power converter IC package is directly coupled to the input voltage terminal.

3. The system of claim 1, wherein the power converter IC package comprises:
a pin-short detection circuit configured to provide an output signal having either a first state or a second state, the first state indicating a primary operation mode and the second state indicating a pin-short operation mode; and
a power transistor configured to be operated by the output signal.

4. The system of claim 3, wherein the power converter IC package is configured to turn off the power transistor in response to the output signal having the second state.

5. The system of claim 3, wherein the transistor is a first transistor, and wherein the power converter IC package comprises a second transistor to provide the output signal responsive to the reference signal.

6. The system of claim 5, wherein the power converter IC package comprises:
a first bias transistor configured to provide a first bias current to control operation of the second transistor based on the reference signal; and
a second bias transistor configured to provide a second bias current to drive the output signal based on the reference signal.

7. The system of claim 4, wherein the power converter IC package comprises multiple bias transistors configured to amplify the second signal before the first transistor compares the first and second signals.

8. A pin-short detection circuit, comprising:
a first transistor having a first gate terminal, a first source terminal, and a first drain terminal, the first gate terminal coupled to an input voltage terminal, and the first source terminal coupled to a first output terminal via multiple bias transistors;
a resistor coupled between the first gate terminal and the first source terminal;
a second transistor having a second gate terminal coupled to the first drain terminal, a second source terminal coupled to a first junction terminal, and a second drain terminal coupled to a second output terminal;
a first bias transistor coupled between the first junction terminal and the first drain terminal; and
a second bias transistor coupled between the first and second output terminals.

9. The pin-short detection circuit of claim 8, wherein the multiple bias transistors comprise:
a third bias transistor having a third gate terminal, a third source terminal and a third drain terminal, the third gate terminal coupled to the third drain terminal and the third source terminal coupled to the first output terminal; and
a fourth transistor having a fourth gate terminal, a fourth source terminal and a fourth drain terminal, the fourth gate terminal coupled to the fourth drain terminal, and the fourth source terminal coupled to the third drain terminal.

10. The pin-short detection circuit of claim 9, further comprising a fifth transistor having a fifth gate terminal, a fifth source terminal and a fifth drain terminal, wherein the fifth drain terminal is coupled to the input voltage terminal, the fifth gate terminal is coupled to the first junction terminal, and the fifth source terminal is coupled to the first gate terminal.

11. The pin-short detection circuit of claim 10, further comprising a sixth transistor having a sixth gate terminal, a sixth source terminal and a sixth drain terminal, the sixth drain terminal coupled to the first source terminal, the sixth source terminal coupled to the fourth drain terminal, and the sixth gate terminal coupled to a third junction terminal.

12. The pin-short detection circuit of claim 11, wherein the sixth transistor is configured to be controlled by a signal at the second output terminal.

13. The pin-short detection circuit of claim 8, wherein a gate terminal of the first bias transistor is coupled to a first bias voltage terminal, and a gate terminal of the second bias transistor is coupled to a second bias voltage terminal.

14. A power converter IC package, comprising:
  a power transistor; and
  a pin-short detection circuit coupled to the power transistor and comprising:
    a first transistor configured to compare first and second signals, the first signal responsive to a signal received at a first package terminal, and the second signal based on a signal received at a second package terminal; and
    a second transistor configured to provide an output signal having either a first state or a second state responsive to the comparison, the first state indicating a primary operation mode, and the second state indicating a pin-short operation mode,
  wherein the power transistor is controlled by the output signal.

15. The power converter IC package of claim 14, further comprising a resistor coupled between a gate terminal and a source terminal of the first transistor.

16. The power converter IC package of claim 14, further comprising:
  a third transistor configured to amplify the first signal to generate a first amplified signal;
  a fourth transistor configured to amplify the first amplified signal to generate a second amplified signal.

17. The power converter IC package of claim 16, wherein the first transistor is configured to compare the second amplified signal to the second signal.

18. The power converter IC package of claim 17, further comprising a first bias transistor coupled to the first transistor, wherein the first bias transistor is configured to provide a first bias current to control the operation of the second transistor.

19. The power converter IC package of claim 18, further comprising a second bias transistor coupled to the second transistor, wherein the second bias transistor is configured to provide a second bias current to drive the output signal when the second transistor is off.

* * * * *